United States Patent [19]

Wood

[11] Patent Number: 4,568,795
[45] Date of Patent: Feb. 4, 1986

[54] INSULATION FILLED CARRIER OF CONDUCTIVE COMPONENTS

[75] Inventor: Theodore H. Wood, Bridgewater, Mass.

[73] Assignee: Alden Research Foundation, Brockton, Mass.

[21] Appl. No.: 524,864

[22] Filed: Aug. 19, 1983

[51] Int. Cl.⁴ .............................................. H05K 5/00
[52] U.S. Cl. .............................. 174/52 PE; 264/273; 264/274
[58] Field of Search ............. 174/52 PE; 264/272.11, 264/272.13, 272.14, 272.18, 273, 274; 338/226; 361/271

[56] References Cited

U.S. PATENT DOCUMENTS 3,226,463 12/1965 Wallace .......................... 264/272.14
3,475,662 10/1969 Zido ................................ 174/52 PE
3,839,660 10/1974 Stryker ...................... 174/52 PE X Primary Examiner—Laramie E. Askin
Assistant Examiner—D. A. Tone
Attorney, Agent, or Firm—James H. Grover

[57] ABSTRACT

An insulated conductor such as an encapsulated electrical circuit is made by locating the circuit components in a preformed carrier with opposed flexible walls with an external, outwardly facing abutment in the shape of a conical opening through each wall. The internal volume between the walls of the carrier is then filled with a hot fluid insulating plastic which also fills the conical opening forming a bridge between the openings. The bridge is caused to cool and set first so that it contracts developing a lengthwise tension which draws the walls toward each other providing the formation of air space between the walls and remainder of the filling.

7 Claims, 4 Drawing Figures

INSULATION FILLED CARRIER OF CONDUCTIVE COMPONENTS

BACKGROUND

It is commonplace in the electrical and electronics industries to encapsulate a circuit or network of connected electrical components such as resistors and capacitors in a matrix of insulating material. In some cases the encapsulated components are a simple subassembly of conductors such as lead wires and connector terminals. During application of fluid insulating material it is not safe to rely on the lead wires connecting the components to hold the several components of the circuit or subassembly in a predetermined spaced relation. One known way of maintaining spacing of the interconnected components is to preform a hollow plastic housing or carrier with internal compartments or supports for holding the components in the desired spaced relation. After locating the components in position inside the carrier, the carrier is then filled with fluid insulation such as a thermoplastic material by potting or injecting the plastic under pressure in a mold.

A major problem arises when filling the carrier, particularly with thermoplastic, because the hot plastic tends to shrink while cooling and setting after filling the carrier so that the filling draws away from the walls of the carrier opening up air space between the carrier and filling. The air space opened may be substantial, 0.01 to 0.02 inch for example, and may extend internally of the carrier so close to the electrical components as to greatly reduce the insulative integrity of the carrier and filling.

It is one object of the present invention to provide an insulation filled carrier of conductive components and a method of making such a conductor which eliminates the formation of air spaces and reduction of insulative integrity.

SUMMARY OF THE INVENTION

According to the invention an insulated electrical conductor comprises a carrier preformed of plastic insulating material with opposed flexible walls about an internal volume, each wall having an external abutment facing outwardly of the volume and in the direction opposite to which the other abutment faces; electrical conductor means in the volume; and a solid insulation filling the volume having an integral portion bridging the walls and extending outside the abutments of both walls, the integral portion being under tension to hold the walls drawn toward each other and the filling and to maintain integrity of the insulation around the conductor.

Further the invention comprises a method of making an insulation filled carrier of conductive components which comprises preforming the carrier with opposed flexible insulative walls about an internal volume; forming an external, outwardly facing abutment on each opposed wall; filling the internal volume of the carrier with fluid plastic insulative material forming a bridge between the abutments which embraces the walls; and preferentially setting the bridge material under tension to draw the walls toward each other and the filling.

DRAWING

DESCRIPTION

Figure 1:
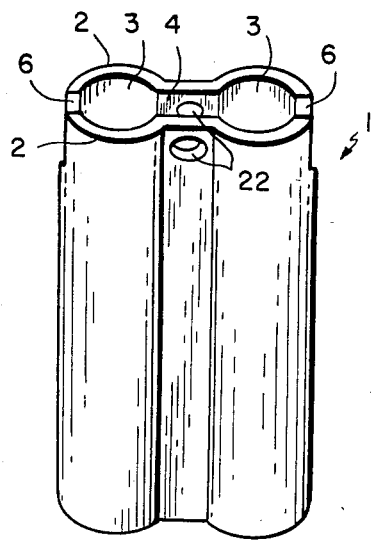
FIG. 1 is an isometric elevation of a preformed carrier of conductive components.

FIG. 1 shows a carrier 1 preformed of insulative material such as thermosetting polypropylene or other insulative plastic. The carrier has opposite walls 2 around an internal volume including two cylindrical chambers 3 and an intermediate narrower passage 4. Slits 6 at the upper, open end of chambers 3 provide access to the internal volume.

Figure 3:
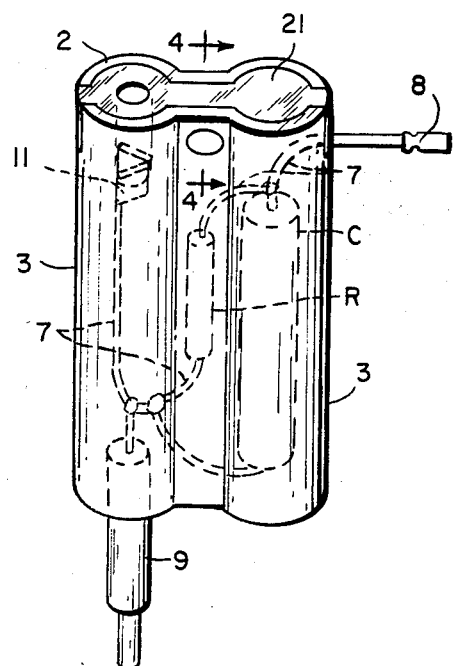
FIG. 3 shows a completed, filled carrier with conductive components.

As shown in FIG. 3 the carrier receives, and holds during filling, an electrical filter network comprising as components a capacitor C, a resistor R interconnected by lead wires 7 to male terminals 8 and 9 and a female terminal 11. The narrow width of passage 4 confines two terminals 9 and 11 to one chamber 3, and the capacitor C to the other chamber 3 but admits the lead wire 7 and the small resistor R.

Figure 2:
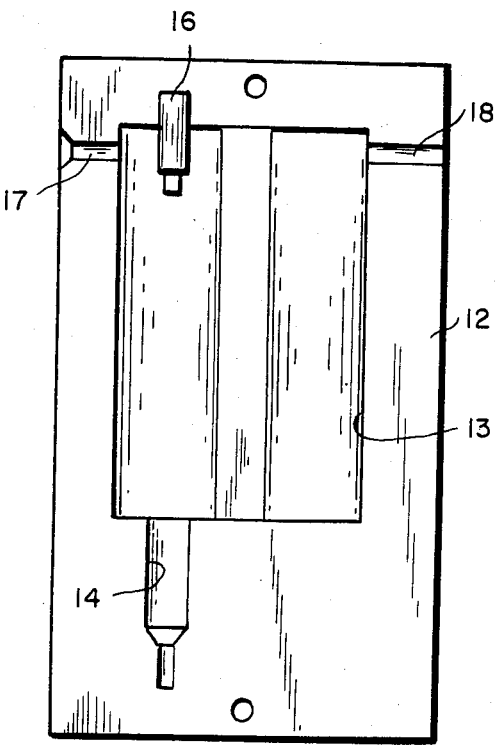
FIG. 2 is an elevation of a half mold for holding the carrier and components during filling.

To encapsulate the components C, R, 7, 8, 9 and 11 in the spaced relation predetermined by the internal chambers 3 and passage 4 of the carrier 1, the carrier is placed in the mold 12, of which one half is shown in FIG. 2, the other half being substantially identical. The mold has a main cavity 13 receiving the premolded carrier 1, a smaller cavity 14 for one male terminal 9, a plug 16 holding the female terminal 11, a plastic entrance gate 17 and a passage 18 receiving the other male terminal 8. Hot, fluid thermoplastic such as polypropylene is injected through the gate 17 to encapsulate the electrical components in a filling 21.

Figure 4:
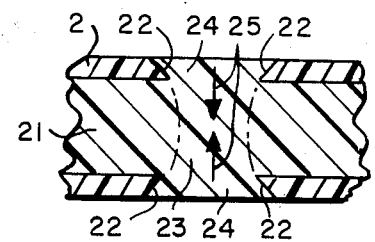
FIG. 4 is a section on line 4—4 of FIG. 3.

According to the present invention each of the walls 2 of the carrier 1 around the internal volume 3, 4 are formed with openings comprising external abutments 22 facing outwardly of the volume 3, 4 and in opposite directions. As shown in FIGS. 1 and 4 the abutments are preferably at the upper, open end of the internal volume 3, 4, and are in the form of conically surfaced openings narrowing, at an angle of about 20° or more for example, inwardly of each wall 2. During molding the openings 22 are occupied by a portion 23 of the filling 21 which forms a bridge between the opposite walls. At each end of the rivet-like bridge 23 are heads 24, one in each opening 22, which widen outwardly of the conical openings 22 so that the bridging portion 23 embraces both walls 2.

Further according to the invention, the abutments of the openings 22 are located at the passage 4 which is the narrowest part of the internal chamber volume 3, 4. At this narrow part the volume of the filling is least and its center of mass is closest to the walls of the mold outside the passage 4. The mass of the metal mold is also greater at the passage 4 than around the chambers 3. These structural provisions cause the bridging portion 23 of the fill, including the heads 24, to cool and set or solidify before the remainder of the filling. Early cooling shrinks the bridge relative to the still unset filling remainder and establishes a tension in the bridge 23 indicated by the arrows 25. This tension in the bridge 23 and the embracing engagement of its heads 24 outside the abutments 22 draws and holds the walls 2 of the carrier 1 together during and after setting of the remainder of the filling so that air spaces do not develop between the carrier and the filling and the integrity of the insulation around the encapsulated components is maintained.

It should be understood that the present disclosure is for the purpose of illustration only and that this invention includes all modifications and equivalents which fall within the scope of the appended claims.

I claim:

1. An insulated electrical conductor comprising:
   a carrier preformed of plastic insulating material with opposed flexible walls about an internal volume, each wall having an opening connected to the internal volume and including an external abutment facing outwardly of the volume and in the direction opposite to which the other abutment faces;
   electrical conductor means in the volume; and
   a solid insulation filling the volume having an integral portion bridging the walls and extending outside the abutments of both walls, the integral portion being under tension to hold the walls drawn toward each other and the filling and to maintain integrity of the insulation around the conductor.

2. A conductor according to claim 1 wherein the carrier walls are open at one end and the bridging portion is adjacent the open end.

3. A conductor according to claim 2 wherein at least one of said abutments is a conically surfaced opening narrowing inwardly of a wall and the bridging portion fills and widens outwardly of the conical opening so as to draw the conical surface inwardly.

4. A conductor according to claim 1 wherein at least one abutment is a conically surfaced opening narrowing inwardly of a wall and the bridging portion fills and widens outwardly of the conical opening so as to draw the conical surface inwardly.

5. A conductor according to claim 3 wherein opposite carrier walls have conically surfaced openings and the bridging tension portion is shaped like a rivet with two heads, one head in each opening.

6. A conductor according to claim 1 wherein the bridging portion embraces both walls.

7. A conductor according to claim 1 wherein the volume is narrower between the abutments than elsewhere within the volume.

* * * * *